United States Patent [19]
Greene

[11] Patent Number: 6,054,940
[45] Date of Patent: Apr. 25, 2000

[54] KEYPAD SCANNING SECURITY SYSTEM

[75] Inventor: John C. Greene, Greensboro, N.C.

[73] Assignee: Gilbarco Inc., Greensboro, N.C.

[21] Appl. No.: 09/020,378

[22] Filed: Feb. 9, 1998

[51] Int. Cl.$^7$ ................................................ H03M 11/00
[52] U.S. Cl. ............................... 341/26; 341/22; 380/52; 379/368
[58] Field of Search ......................... 341/22, 26; 380/52; 340/825.31, 825.79; 379/368

[56] References Cited

U.S. PATENT DOCUMENTS

| | | | |
|---|---|---|---|
| 4,479,112 | 10/1984 | Hirsch | 340/825.31 |
| 4,926,173 | 5/1990 | Frielink | 341/22 |
| 5,025,255 | 6/1991 | Mould | 341/26 |
| 5,254,989 | 10/1993 | Verrier | 341/26 |
| 5,280,283 | 1/1994 | Raasch | 341/26 |

*Primary Examiner*—Michael Horabik
*Assistant Examiner*—Albert K. Wong

*Attorney, Agent, or Firm*—Coats & Bennett, P.L.L.C.

[57] ABSTRACT

A secure keypad device incorporating measures to prohibit electronic eavesdropping. Random interrogation of the rows and/or columns of a keypad matrix is employed to determine which key has been pressed. Implementation of the random interrogation process utilizes the mathematical factorial (!) function in conjunction with an algorithm that derives an interrogation sequence. A random number is generated and fed to an algorithm which will derive an interrogation sequence. The sequence is relayed to a keypad scanner which performs the actual interrogation in order to determine which key has been pressed. Further measures are taken to guard against electronic eavesdropping. For instance, the algorithm is designed to take the same amount of time for an unsuccessful key scan as it does for a successful key scan. Also, the time spent on an unpressed scan line is approximately equal to the time required to record a valid key press.

13 Claims, 4 Drawing Sheets

RndNum = 13  
scanFact = 4! = 24

⇒ Index:  
⇒ Column:

Remaining Columns  
<u>0</u>  1   2   3  
 0   1   2   3 colNum = rndNum MOD scanFact = 13 MOD 24 = 13  
scanFact = 3! = 6  
colNum / scanFact = 13 / 6 = 2 ⇒

⇒ Column:

Index:

Remaining Columns  
 0   1   <u>2</u>   3  
 0   1   <u>2</u>   3 colNum = rndNum MOD scanFact = 13 MOD 6 = 1  
scanFact = 2! = 2  
colNum / scanFact = 1 / 2 = 0 ⇒

⇒ Column:

Index:

Remaining Columns  
 <u>0</u>   1   2   3  
 <u>0</u>   1   3 colNum = rndNum MOD scanFact = 13 MOD 2 = 1  
scanFact = 1! = 1  
colNum / scanFact = 1 / 1 = 1 ⇒

⇒ Column:

Index:

Remaining Columns  
 0   1   2   3  
 1   <u>3</u> colNum = rndNum MOD scanFact = 13 MOD 1 = 0  
scanFact = 0! = 1  
colNum / scanFact = 0 / 1 = 0 ⇒

⇒ Column:

Index:

Remaining Columns  
 0   1   2   3  
 <u>1</u>

*Sequence* ⇒⇒⇒ *2-0-3-1*

FIG. 3

RndNum = 3  
scanFact = 4! = 24

Index:      *Remaining Columns*  
          <u>0</u>   <u>1</u>   <u>2</u>   <u>3</u>  
⇒ Column:   0   1   2   3 colNum = rndNum MOD scanFact = 3 MOD 24 = 3  
scanFact = 3! = 6  
colNum / scanFact = 3 / 6 = 0 ⇒

Index:      *Remaining Columns*  
          <u>0</u>   <u>1</u>   <u>2</u>   <u>3</u>  
⇒ Column:   <u>0</u>   1   2   3 colNum = rndNum MOD scanFact = 3 MOD 6 = 3  
scanFact = 2! = 2  
colNum / scanFact = 3 / 2 = 1 ⇒

Index:      *Remaining Columns*  
          <u>0</u>   <u>1</u>   <u>2</u>   <u>3</u>  
⇒ Column:   1   <u>2</u>   3 colNum = rndNum MOD scanFact = 3 MOD 2 = 1  
scanFact = 1! = 1  
colNum / scanFact = 1 / 1 = 1 ⇒

Index:      *Remaining Columns*  
          <u>0</u>   <u>1</u>   <u>2</u>   <u>3</u>  
⇒ Column:   1   <u>3</u> colNum = rndNum MOD scanFact = 3 MOD 1 = 0  
scanFact = 0! = 1  
colNum / scanFact = 0 / 1 = 0 ⇒

Index:      *Remaining Columns*  
          <u>0</u>   <u>1</u>   <u>2</u>   <u>3</u>  
⇒ Column:   <u>1</u>

*Sequence* ⇨⇨⇨ *0-2-3-1*

FIG. 4

KEYPAD SCANNING SECURITY SYSTEM

TECHNICAL FIELD

The present invention relates to a keypad scanning security system. More particularly, the present invention relates to a keypad scanning security system whereby measures are taken to prohibit electronic eavesdropping of a keypad device while keys are being depressed.

BACKGROUND ART

Conventional security keypads are alpha-numeric and usually arranged in some type of matrix configuration, e.g. row-column configuration. Such keypads are used to authorize or verify the identification of an individual seeking to gain access to certain areas or devices. It will be appreciated by one ordinarily skilled in the art, however, that keypads may be used for other purposes as well.

Typically, an individual will be given an access code that must be entered into the keypad to receive authorization. The keypad usually has a set of row conductors, one conductor corresponding to each row, and a set of column conductors, one conductor corresponding to each column. When a particular key is depressed, an electrical connection of that key's row and column conductor is formed and a signal is sent to a processor which can identify the depressed key. Identification is accomplished by having the processor interrogate the rows and columns to see if any are in an active state, e.g. if a specific signal is present. An active state can only be achieved when a key is depressed which causes a row conductor to physically contact a column conductor thereby creating a closed circuit.

The processor interrogates the rows and/or columns continuously in order to determine when keys are depressed. Most processors will perform the interrogation in a particular non-varying sequence. A problem that may arise under such an interrogation process is that certain electronic devices are capable of eavesdropping on an individual as the individual depresses the keypad. This is possible because electromagnetic radiation is emitted by the keyboard when a key is depressed. The characteristics of this emitted radiation vary when a row or column is interrogated which has a key depressed. Further, the characteristics of this emitted radiation also differ depending on which key in the row or column is pressed. Consequently, it is possible for an individual possessing electronic eavesdropping equipment to detect the emitted radiation from the keypad and process same to determine the exact keys pressed and the sequence in which they were pressed.

One solution to the above described eavesdropping problem is to randomly interrogate the rows and/or columns. Random interrogation prevents an eavesdropper from establishing a repetitive baseline pattern needed to compare the detected radiation against. Without a baseline pattern it becomes impossible for an eavesdropper to correspond a certain distinct level of emitted radiation with a specific row and/or column.

U.S. Pat. No. 5,025,255 to Mould describes a secure keyboard with random order of interrogation in which the processor associated with the keyboard generates a random number which is then associated with a particular row to be interrogated. In the preferred embodiment, this process is repeated until all of the rows have been interrogated. This is a computationally taxing method since, after each random number is generated, a check must be performed to determine whether the row associated with that random number has already been interrogated, and, if so, a new random number must be generated and checked again until a random number corresponding to a row that has not been selected is returned. As the number of rows dwindles, the odds of a random number corresponding to a row already selected increase substantially. Thus, significantly many more random number generations than number of rows may be required to finish one complete set of row interrogations.

A second embodiment of U.S. Pat. No. 5,025,255 to Mould describes selection of an entire sequence of rows to be interrogated all at once rather than generating a random number for each row. This embodiment requires that each entire sequence be stored in memory. Thus, as the number of columns grows the amount of memory required to store the interrogation sequences grows exponentially.

A third embodiment of U.S. Pat. No. 5,025,255 to Mould describes using a random number generator to generate a random number which corresponds to a memory location containing an interrogation sequence. This embodiment suffers from the same shortcomings as the second embodiment, namely, a large memory requirement.

DISCLOSURE OF THE INVENTION

The present invention is a secure keypad device incorporating measures to prohibit electronic eavesdropping. To that end, a novel method of random interrogation of the rows and/or columns of the keypad matrix is employed to determine which key has been pressed. Random interrogation denies an eavesdropper the opportunity to establish a baseline pattern against which to measure emitted radiation characteristics associated with each key.

Implementation of the random interrogation process utilizes the mathematical factorial (!) function in conjunction with an algorithm that derives a row or column interrogation order. Consider, for instance, a keypad having four (4) rows and four (4) columns. If one wishes to interrogate each column, the number of possible column interrogation sequences is twenty-four (24), or 4! (4×3×2×1). The present invention generates a random number that is fed to an algorithm which will derive an interrogation sequence. The sequence is relayed to a keypad scanner which performs the actual interrogation in order to determine which key has been pressed.

Further measures are taken to guard against electronic eavesdropping. For instance, the algorithm is designed to take the same amount of time for an unsuccessful key scan as it does for a successful key scan. Further, the time spent on an unpressed scan line is approximately equal to the time required to record a valid key press.

One object of the invention is to provide a secure system for entering data into a keypad scanning device that is resistant to electronic eavesdropping attempts.

It is another object of the invention to provide a system and method of randomly scanning and interrogating the rows and columns of a keypad.

It is still another object of the invention to spend the same amount of time scanning and interrogating rows or columns of a keypad in which a key has been pressed as scanning and interrogating rows or columns of a keypad in which a key has not been pressed.

BEST MODE FOR CARRYING OUT THE INVENTION

Keypad systems are used in numerous applications that require operator input. Frequently, the applications are security conscious with respect to the information being input by the operator. In such applications it is highly desirable to have the operator's input obscured from visual and electronic eavesdropping. The present invention is directed toward thwarting electronic eavesdropping devices from determining information input into a keypad by an operator.

Figure 1:
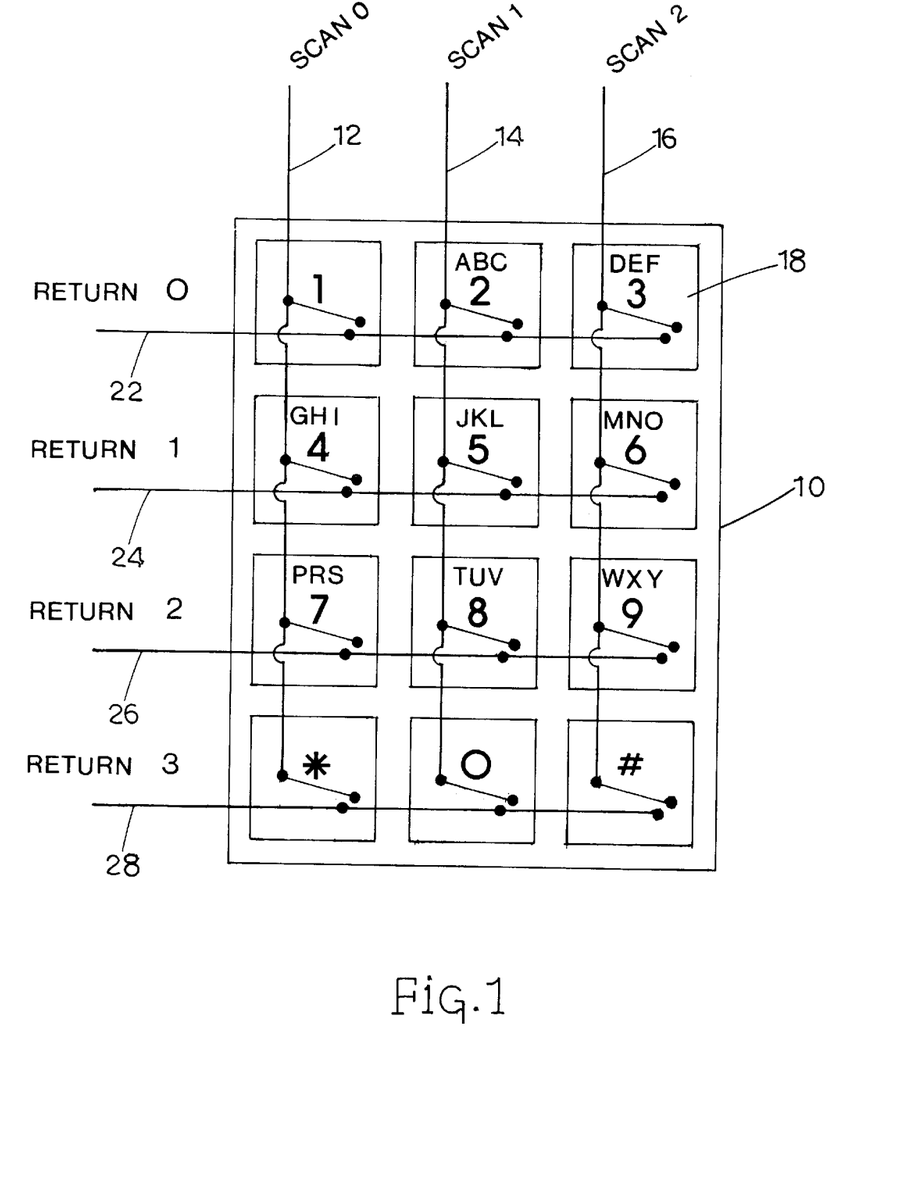
FIG. 1 is a schematic view of a typical keypad matrix diagram.

Referring now to the drawings, FIG. 1 illustrates a keypad 10 having a four (4) row, three (3) column matrix configuration similar to a standard telephone keypad. Also shown are a set of scan lines 12, 14, 16 electrically connected to the keypad columns and a set of return lines 22, 24, 26, 28 electrically connected to the keypad rows. Each key has an associated switch 18 (see key "3" as an example) which when depressed creates an electrical connection between that key's scan line and return line. Depression of a key closes a circuit sending an electrical impulse or signal to a keypad scanner and processor (not shown in FIG. 1). The processor can then determine which key has been depressed based on the particular scan/return line that returned the electrical impulse or signal.

Figure 2:
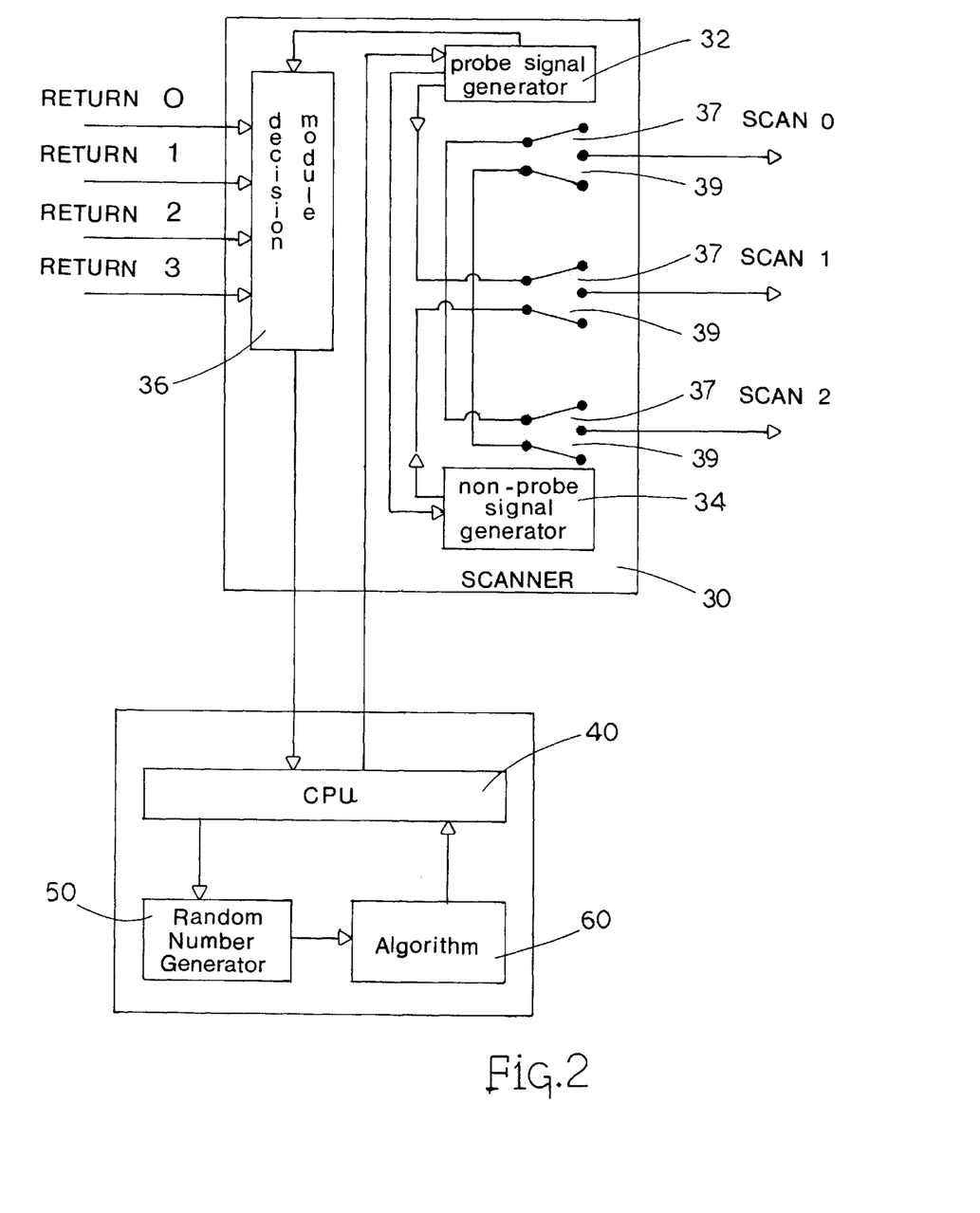
FIG. 2 is a schematic view of the components of the keypad scanning security system of the present invention.

Referring now to FIG. 2, key presses are decoded by a scanner 30 which detects a switch closure between a row and a column. For instance, if the column labeled "scan 1" was shorted to the row labeled "return 2", i.e. the switch was closed, it could be determined that the key labeled "8" was pressed. This is achieved by having scanner 30 generate a probe signal on one scan line of the keypad matrix while generating a different non-probe signal 34 on the remaining scan lines. Scanner 30 then checks the return lines for the probe signal. If the probe signal is detected on one of the return lines, the exact key pressed can be ascertained since it is known which scan line is being probed and which return line passed the probe signal. The process is repeated for each scan line in order to scan the entire keypad matrix.

Generation of the probe signal generally causes alterations in the power supply current and/or radiated emissions of the keypad scanning module. Such alterations may be readily detected and analyzed by external apparatus such as a spectrum analyzer or an oscilloscope. Once detected, the emitted radiation may be decoded to provide the sequence of the keys that were just input.

The present invention thwarts such action by randomly interrogating the keypad to determine which keys have been pressed. The system operates as follows. Processor 40 sends a signal to random number generator 50 instructing it to generate a random number. A random number is generated and fed to algorithm 60. Random number generator 50 utilizes a high speed, free running counter driven by a low precision oscillator. The sampling of the counter occurs when a character is received on the serial port of the secure keypad. Care is taken to ensure there is enough serial transfer to yield a flat distribution of random numbers for keypad scanning. Further, if a random number greater than the number of possible combinations of interrogation sequences (i.e., number of columns or rows factorial) is generated, then the random number is divided by the number of possible combinations of interrogation sequences and the remainder is fed as input to Algorithm 60.

Algorithm 60 receives the random number as input and returns a row or column interrogation sequence back to processor 40. Processor 40 then relays the scan line (row or column) interrogation sequence to probe signal generator 32 within scanner 30. Probe signal generator 32 informs non-probe signal generator 34 and decision module 36 of the scan line interrogation sequence before initiating actual interrogation. Interrogation starts when probe signal generator 32 closes switch 37 for the first scan line of the interrogation sequence. Simultaneously, non-probe signal generator 34 closes the switches 39 for the remaining scan lines ensuring a different signal is sent over the scan lines not being interrogated. Meanwhile, decision module 36 monitors the return lines checking for a return of the probe signal. This process is repeated until all the scan lines have been interrogated. When a probe signal is detected on a return line, decision module 36 compares it against the current scan line to determine the exact key that was pressed.

It is evident that once a probe signal is returned the process can be stopped for that cycle. A cycle is defined as one complete interrogation of all the scan lines. However, the present invention will finish interrogating the remaining scan lines of the sequence knowing that a probe signal will not be present. The purpose of this is to ensure that the time taken to identify a key press is about the same every time thereby negating any attempts to derive key press information based upon different cycle times for an interrogation sequence. Since the present invention interrogates every scan line in each cycle, all the cycle times will be about equal. Moreover, the time spent on a scan line that returns a probe signal is made the same as the time spent on a scan line that does not produce a probe signal. Again, the purpose is not to give any information away to an eavesdropper which may aid in deciphering which key has been pressed. By ensuring that the timing for valid and invalid scan lines are the same no usable information with respect to the time taken may be derived.

Figure 3:
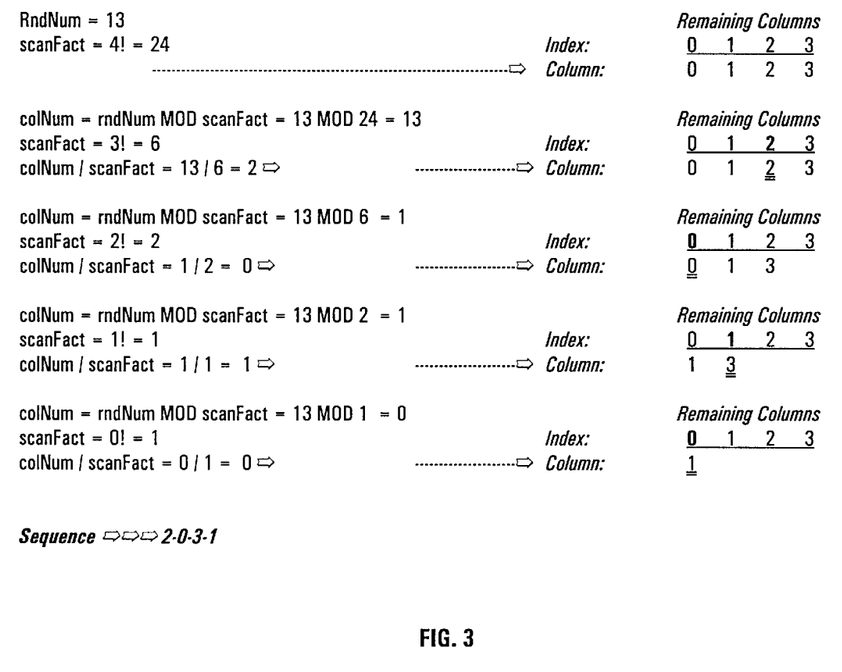
FIGS. 3 and 4 illustrate examples, respectively, of how the row/column interrogation algorithm of the keypad scanning security system of the present invention operates given a random number input.

Referring now to FIG. 3, a random number, 13 in this instance, is generated and input into the algorithm for the purposes of generating a row/column interrogation sequence. Since there are four columns for this example the total number of possible interrogation sequences is equal to 4!=24. Thus, the initial scan factorial value (scanFact) is 24. The first step in the algorithm is to determine the index position that will yield the first value of the interrogation sequence. The first step is to obtain the remainder of the random number (rndNum) divided by the current scan factorial value (scanFact) which can be expressed as rnd-Num MOD scanFact. In the example illustrated in FIG. 3, the initial column number (colNum) is equal to 13 MOD 24=13. The next step is to decrement and re-calculate the scan factorial value (scanFact). In the present example, the new scanFact is 3!=6. The index position that will yield the first value of the interrogation sequence is then determined by dividing the column number (colNum) by the new scan factorial value (scanFact) ignoring any remainder. In this case the index position is 13/6=2.

The next step is to fill in the "column values" under the index values. This is done by inserting the sequence 0-1-2-3 below the respective index positions. For the present example, we know that index 2 will yield the first value of the interrogation sequence. The sequence is inserted as follows: 0|1|2|3. The column number in index position 2 corresponds to the first value of the interrogation sequence. Therefore, 2 is the first value of the interrogation sequence. The number of columns is reduced by one and the value 2 is stricken from the eligible values since it was just selected. The process is then repeated until there are no remaining columns left.

The next value of the interrogation sequence is determined by obtaining a new column number (colNum) which is 13 MOD 6=1. Note that the scan factorial value (scanFact) is now 6 instead of 24. A new scan factorial value (scanFact) is calculated, this time it is 2!=2. The index position that will yield the next value of the interrogation sequence is calculated as column number (colNum) divided by scan factorial value (scanFact)=1/2=0. Remember that remainders are ignored. This time the sequence is inserted as follows: 0|1|3. Note that column 3 has been eliminated since the number of columns remaining has been reduced by one. Moreover, the value 2 has been eliminated since it was previously selected. Examination of index position 0 yields a 0. Therefore, the second value of the interrogation sequence is 0. The remaining columns are again reduced by one and the value 0 is stricken from the eligible values leaving a 1 and a 3.

The next value of the interrogation sequence is determined by obtaining a new column number (colNum) which is 13 MOD 2=1. A new scan factorial value (scanFact) is calculated, this time it is 1!=1. The index position that will yield the next value of the interrogation sequence is calculated as column number (colNum) divided by scan factorial value (scanFact)=1/1=1. This time the sequence is inserted as follows: 1|3. Remember, the values 2 and 0 have been eliminated since they were previously selected. Examination of index position 1 yields a 3. Therefore, the third value of the interrogation sequence is 3. The remaining columns are again reduced and the value 3 is also stricken from the eligible values leaving a 1.

The last value of the interrogation sequence is determined by obtaining a new column number (colNum) which is 13 MOD 1=0. Next, a new scan factorial value (scanFact) is calculated, this time it is 0!=1. The index position that will yield the last value of the interrogation sequence is calculated as column number (colNum) divided by scan factorial value (scanFact)=0/1=0. This time the sequence is inserted as follows: 1. Examination of index position 0 yields a 1. Therefore, the last value of the interrogation sequence is 1. There being no more columns to process, the sequence for random number (rndNum) 13 is returned as 2-0-3-1. Thus, the keypad scanner will interrogate column 2, column 0, column 3, and finally column 1 in order to determine whether a key press has been made, and, if so, which key has been pressed.

Figure 4:
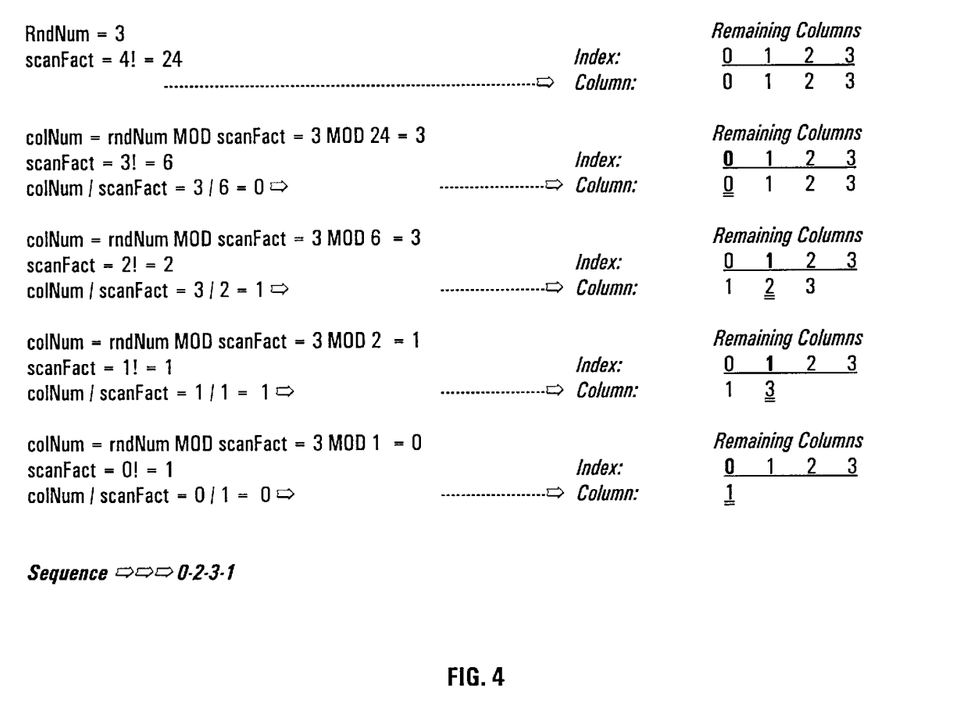

To further illustrate applicant's invention, a second example shown in FIG. 4 is included for comparative purposes. Take the random number 3 for instance. The initial scan factorial value (scanFact) is 24. The initial column number (colNum) is equal to 3 MOD 24=3. The new scanFact is 3!=6. The index position that will yield the first value of the interrogation sequence is 3/6=0, ignoring remainder. The sequence is inserted as follows: 0|1|2|3. The value in index position 0 corresponds to the first value of the interrogation sequence which, for this example, is 0. The remaining columns are reduced and 0 is stricken from the eligible values. The second value of the interrogation sequence is determined by obtaining a new column number (colNum) which is 3 MOD 6=3. A new scan factorial value (scanFact) is calculated, this time it is 2!=2. The new index position that will yield the next value of the interrogation sequence is calculated as column number (colNum) divided by scan factorial value (scanFact)=3/2=1. Remember that remainders are ignored. This time the sequence is inserted as follows: 1|2|3. Examination of index position 1 yields a 2. Therefore, the second value of the interrogation sequence is 2. The third value of the interrogation sequence is determined by obtaining a new column number (colNum) which is 3 MOD 2=1. A new scan factorial value (scanFact) is calculated as 1!=1. The new index position that will yield the next value of the interrogation sequence is calculated as column number (colNum) divided by scan factorial value (scanFact)=1/1=1. This time the sequence is inserted as follows: 1|3. Examination of index position 1 yields a 3. Therefore, the third value of the interrogation sequence is 3. The last value of the interrogation sequence is determined by obtaining a new column number (colNum) which is 3 MOD 1=0. A new scan factorial value (scanFact) is calculated as 0!=1. The new index position that will yield the last value of the interrogation sequence is calculated as column number (colNum) divided by scan factorial value (scanFact)=0/1=0. This time the sequence is inserted as follows: 1. Examination of index position 0 yields a 1. Therefore, the last value of the interrogation sequence is 1 and the entire sequence is 0-2-3-1.

The present invention may be employed in multiple key scanning architectures. Some architectures involve constant active probing of the keypad scan lines, while others probe all scan lines at once until a return line passes a probe signal, after which, active probing begins. Additionally, some architectures check keypad return lines one by one, while others may be able to respond to stimulus from any return line without specifically checking it. The present invention may be employed in any or all of the above described architectures.

The terms row(s) and column(s) and row conductor(s) and column conductor(s) are interchangeable throughout the specification and claims herein. In other words, scan lines may correspond to rows or columns or row conductor(s) or column conductor(s). Conversely, return lines may correspond to rows or columns or row conductor(s) or column conductor(s). Implementation of scan lines and return lines as rows or columns or row conductor(s) or column conductor(s) is merely a design choice.

A 3×4 matrix configuration has been described herein for illustrative purposes only. One ordinarily skilled in the art can readily apply the teachings to matrices of varying configurations. Thus, the scope of the disclosure herein is not limited to a 3×4 matrix configuration.

Applicant contemplates that a preferred implementation of the subject invention is in combination with computerized fuel dispensing systems, e.g. gasoline pumps in which payment for fuel dispensed is made via deducting from a customer's credit or debit card that requires a code to be entered into a keypad in order to verify the transaction. However, applicant further contemplates that the secure keypad scanning system may be used in a variety of other implementations such as (ATM) automated teller machines, point-of-sale (POS) car wash systems in which a customer is given a code either at a gasoline pump dispenser or at the cashier inside a convenience store, for instance, for entry into a keypad at the car wash site, or any other PIN pad devices requiring a user to enter a code into a keypad system.

It will be understood that various details of the invention may be changed without departing from the scope of the invention. Furthermore, the foregoing description is for the purpose of illustration only, and not for the purpose of limitation—the invention being defined by the claims.

Computer Printout of Pseudo-Source Code (No more than 10 pages)

```
**  This function derives from an input random number the sequence in which to probe the key scan lines. All possible
    sequences can be generated from number ranges that exceed the maximum number of possible sequences
define MAX_COLUMNS        ?         Number of key scan lines on the keypad to be scanned
define MAX_NUM_SEQ        ?         Number of scan sequences for # of columns (i.e. Factorial
                                    (MAX_COLUMNS))
define MAX_ROWS           ?         Number of key return lines on the keypad to be scanned
define NO_SCAN_STATUS     ?         All column scan bits are held active in order to detect any input
define PAD_OPEN           ?         The value of the row input port when all column outputs are in standby
*** Fixed-Duration Variable Declarations ***
declare fixed-dur boolean
    buttonPressed = FALSE           TRUE if a button has been detected and has not disappeared yet.
declarefixed-dur constant integer
    padLayout [MAX_ROWS] [MAX_COLUMNS] = Button values to return to calling task decoded from row and column values
    :BEGIN:
            { button return values for row    1        , columns 1 - <MAX_COLUMNS> },
            { button return values for row    2        , columns 1 - <MAX_COLUMNS> },
                                             ***
            { button return values for row  <MAX_ROWS> , columns 1 - <MAX_COLUMNS> },
    :END:
These variables must have the same access time. Therefore, declared fixed-dur.
declare fixed-dur unsigned 16-bit integer
    colUsed                         Tracks the lines already probed in sequence.
                                    Later used to store column entered.
declare fixed-dur unsigned 16-bit integer
    keyRowVal                       Stores row mask read. Later used for dummy storage.
function returning unsigned integer: PadDecode (unsigned 16 bit rndNum)
    declare unsigned 16-bit integer
        scanNum = MAX_COLUMNS       Tracks the number of key scans peformed in this cycle
    declare unsigned 16-bit integer
        scanFact = MAX_NUM_SEQ      Tracks the number of possihle key scan sequences remaining for this cycle
    declare unsigned 16-bit integer
        scanLine                    Represents the key scan line to be probed next. Later used as row storage
    declare unsigned 16-bit integer
        scanMask                    Represents the mask for the scan line to be probed next
    declare unsigned 16-bit integer
        colNum                      Represents which of the remaining scan lines to probe next
:BEGIN:
    keyRowVal = port(row_in)        Store row mask read.
    If any scan lines show activity . . .
    if (keyRowVal ≠ PAD_OPEN)
    Toggle button press indicator and begin scanning.
    :BEGIN:
        colUsed = 0                 Initialize. No columns used yet.
        If we've alreedy captured a button . . .
        if (buttonPressed)
            return (No_BUTTON)      Report no new button pressed.
        Else, this is the first read of this keypress. Decode button value
        buttonPressed = TRUE        Indicate a button capture
        While there are key scan lines remaining to be probed . . .
        while (scanNum > 0)
        Pick scan line based on the random number received and store it in sequence buffer
        :BEGIN:
            colNum = (rndNum MOD scanFact)    colNum = A random number in the range of possible remaining scan sequences
            scanFact = scanFact / scanNum     scanFact = The remaining possible key scan sequences.
            scanNum = scanNum - 1             scanNum decremented
            colNum = (colNum / scanFact) + 1  colNum = The nth element in a list of remaining scan lines to be probed
            Find the scan line number corresponding to nth element in the list of remaining key scan lines.
            scanLine = 0                      Initialize. No scan line has been determined yet.
            scanMask = 1                      Initialize. No scan mask has been detemnined yet.
            while (POST-DECREMENT (coNum) ≠ 0)
            :BEGIN:
                Skip over key scan lines that have already been used in this cycle
                while ((colUsed AND scanMask) ≠ 0)
                :BEGIN:
                    scanLine = scanLine + 1   Skip over key scan line
                    scanMask = LSHLFT (scanMask)  Skip over corresponding mask pattern
                :END:
                scanLine = scanLine + 1
                scanMask = LSHIFT (scanMask)
            :END:
            scanLine = scanLine - 1           scanLine = The key scan line to be probed next
            scanMask = RSHIFT (scanMask)      scanMask = The key scan mask to be used next
            scanLineSeq[scanNum] = (unsigned 8-bit integer)
                scanLine                      Store line to be probed in sequence array
            scanMaskSeq[scanNum] = (unsigned 8-bit integer)
```

```
        scanMask                             Store mask to be used in sequence array
        colUsed = colUsed OR scanMask        Mark key scan line as used in the list of key scan lines
    :END:
    Note: Exit values: coUsed ≧ MAX_COLUMNS, colNum = 0xFFFF These will be used later
    scanLine = 0                             Re-initialize for use as storage for row number of button pressed
    scanMask = 1                             Re-initialize for use as storage for row mask pattern of button pressed
    Decode the row of the button and store it in scanLine
    while ((keyRowVal AND scanMask) = 0)
    :BEGIN:
        scanLine = scanLine + 1              Skip over key scan line
        scanMask = LSHIFT (scanMask)         Skip over corresponding mask pattern
    :END:
Decode: Label referenced below in 2 places.
        Used to completely control looping in order to keep timing equal regardless of input data.
    Decode the column of the button (random scan sequence) and store it in colUsed
    if (PRE-INCREMENT (colNum) < MAX_COLUMNS)
    This block is designed to take the same amount of time regardless of the input data.
    :BEGIN:
        port(col_out) = scanMaskSeq[colNum]  Pick a column mask from the random sequence determined above
        scanNum = MIN(colUsed,
            scanLineSeq[colNum])             scanNum = The minimum of the column pressed and the current column
        delay ()                             Delay task to allow ports to stabilize
        If the a 1 on the input line masked out by scanMask appears . . .
        if ((port(row_in) AND (unsigned 8-bit integer) scanMask) ≠ 0)
        :BEGIN:
            colUsed = scanNum                Current column is pressed. Store the leftmost column pressed in colUsed.
            goto Decode                      Using "goto" to completely control looping in order to keep timing equal
        :END:
        Else, the 1 on the input line did not appear . . .
        keyRowVal = scanNum                  Current column is not pressed. Eat up some time.
        goto Decode                          Using "goto" to completely control looping in order to keep timing equal
    :END:
    port(col_out) = NO_SCAN_STATUS           Set all keypad scan times to their idle state.
    If we read a valid column . . .
    if (colUsed < MAX_COLUMNS)
    Return the button pressed
        return (padLayout [scanLine][colUsed])
    :END:
    Else, no scan lines show activity . . .
    else
        buttonPressed = FALSE                Indicate no button press detected
        return (NO_BUTTON)                   No valid button was read. Return NO_BUTTON
:END:
```

What is claimed is:

1. A method of determining a random interrogation sequence within a computer processor for a plurality of columns comprising the steps of:

(a) initializing, within said computer processor, an index of positions wherein a column number corresponds to each index position;

(b) determining a scan factorial variable by calculating in said computer processor the number of columns factorial;

(c) generating a random number in said computer processor;

(d) calculating a column variable according to the remainder obtained by dividing said random number by said scan factorial variable;

(e) reducing the number of columns by one and re-calculating said scan factorial variable using said reduced column number;

(f) dividing said col-num variable by said scan factorial variable, ignoring any remainder, thereby yielding an index position;

(g) corresponding the remaining column numbers with the remaining index positions;

(h) determining the next column number of said interrogation sequence as the column number corresponding to the index position determined in step (f);

(i) removing the column number determined in step (h) from the pool of eligible column numbers;

(j) reducing the number of index positions by one; and (k) repeating steps (d) through (j) in said computer processor until there are no remaining column numbers.

2. A method of randomly interrogating a plurality of column conductors of a keypad matrix for a specified signal present on one of a plurality of row conductors in order to determine whether a column conductor and a row conductor have been shorted together indicating that a specific key has been pressed, said method comprising the steps of:

(a) generating a random number;

(b) inputting said random number into a algorithm which will determine an interrogation sequence for said column conductors;

(c) interrogating said column conductors according to the sequence determined by said algorithm in order to determine whether said specified signal is present on one of said column conductors;

(d) corresponding the current row conductor and the column conductor possessing the specified signal with a specific key on said keypad; and (e) repeating steps (a) through (d) for each row conductor wherein determination of said algorithm comprises the steps of:

(f) initializing an index of positions wherein a column conductor number corresponds to each index position;

(g) determining a scan factorial variable by calculating the number of columns factorial;
(h) receiving said random number;
(i) calculating a col-umn variable according to the remainder obtained by dividing said random number by said scan factorial variable;
(j) reducing the number of columns by one and re-calculating said scan factorial variable using said reduced column number;
(k) dividing said col-num variable by said scan factorial variable, ignoring any remainder, thereby yielding an index position;
(l) corresponding the remaining column conductor numbers with the remaining index positions;
(m) determining the next column conductor number of said interrogation sequence as the column conductor number corresponding to the index position determined in step (k);
(n) removing the column conductor number determined in step (m) from the pool of eligible column conductor numbers;
(o) reducing the number of index positions by one; and
(p) repeating steps (i) through (o) until there are no remaining column conductor numbers.

3. The method of claim 2 in which steps (a) through (p) are repeated periodically.

4. The method of claim 2 in which steps (a) through (p) are repeated continuously.

5. An apparatus for securely interrogating a plurality of scan conductors of a keypad matrix to identify a key being pressed, comprising:
(a) a keypad having a plurality of keys arranged in a row-column matrix configuration;
(b) a plurality of scan conductors electrically connected to rows or columns of said keypad;
(c) a plurality of return conductors electrically connected to rows or columns of said keypad;
(d) a keypad scanner for sending a probe signal over one of said scan conductors and monitoring said return conductors for said probe signal in order to identify a key being pressed;
(e) a processor for generating a random interrogation sequence for said scan conductors; and
(f) said interrogation sequence being generated in a definitive number of steps every time said sequence is generated.

6. The apparatus of claim 5 wherein said processor comprises:
(a) a random number generator for generating a random number; and
(b) an algorithm for receiving said random number and generating said interrogation sequence,
wherein said interrogation sequence generated by said algorithm is forwarded to a decisions module for interrogation of said scan conductors according to the sequence in order to identify a key being pressed.

7. The apparatus of claim 6 wherein the time spent on an interrogation of said scan conductor is the same whether or not a key has been pressed.

8. The apparatus of claim 6 wherein said random number generator comprises a high speed free running counter driven by a low precision oscillator.

9. The apparatus of claim 5 wherein the time spent on an interrogation of said scan conductor is the same whether or not a key has been pressed.

10. An apparatus for securely interrogating a plurality of scan conductors of a keypad matrix to identify a key being pressed, comprising:
(a) a keypad having a plurality of keys arranged in a row-column matrix configuration;
(b) a plurality of scan conductors electrically connected to rows or columns of said keypad;
(c) a plurality of return conductors electrically connected to rows or columns of said keypad;
(d) a keypad scanner for sending a probe signal over one of said scan conductors and monitoring said return conductors for said probe signal in order to identify a key being pressed;
(e) a processor for generating a random interrogation sequence for said scan conductors; and
(f) each said scan conductor during said random interrogation sequence being interrogated for the same amount of time whether or not a key has been pressed.

11. The apparatus of claim 10 wherein said processor comprises:
(a) a random number generator for generating a random number; and
(b) an algorithm for receiving said random number and generating said interrogation sequence,
wherein said interrogation sequence generated by said algorithm is forwarded to a decisions module for interrogation of said scan conductors according to the sequence in order to identify a key being pressed.

12. The apparatus of claim 11 wherein said random number generator comprises a high speed free running counter driven by a low precision oscillator.

13. The apparatus of claim 5 wherein said processor uses a factorial variable to determine said interrogation sequence.

* * * * *